United States Patent

Nicolau et al.

Patent Number: 6,066,438
Date of Patent: May 23, 2000

[54] METHOD FOR FIXING FUNCTIONAL MATERIAL AND PATTERNED FUNCTIONAL MATERIAL

[75] Inventors: Dan V. Nicolau, Murdoch, Australia; Takahisa Taguchi, Kawanishi; Susumu Yoshikawa, Ikeda, both of Japan

[73] Assignee: Director General of Industrial Science & Technology, Tokyo, Japan

[21] Appl. No.: 08/834,545

[22] Filed: Mar. 10, 1997

[30] Foreign Application Priority Data

Mar. 8, 1996 [JP] Japan .................................. 8-080742

[51] Int. Cl.[7] .............................. A03F 7/30; G03F 7/023
[52] U.S. Cl. ...................... 430/330; 430/165; 430/191; 430/192; 430/325; 430/326
[58] Field of Search ................. 430/270.1, 325, 430/326, 192, 191, 165, 330

[56] References Cited

U.S. PATENT DOCUMENTS 5,134,057  7/1992  Kuypers et al. ........................ 430/325

FOREIGN PATENT DOCUMENTS 7-84371  3/1995  Japan .
7-168356  7/1995  Japan .

OTHER PUBLICATIONS

H. Morgan, et al., Photo–patterning of sensor surfaces with biomolecular structures: characterisation using AFM and fluorescence microscopy, Biosensors & Bioelectronics 10 (1995) 841–846.

Steven A. Sundberg, et al., Spatially–Addressable Immobilization of Macromolecules on Solid Supports, J. Am. Chem. Soc. 1995, 117, 12050–12057.

*Primary Examiner*—John S. Chu
*Attorney, Agent, or Firm*—Knobbe, Martens Olson & Bear, LLP

[57] ABSTRACT

A method for fixing, on a substrate, functional material such as proteins, enzymes, polysaccharides, nucleic acids, microorganisms, viruses and cultured cells, includes the steps of (i) forming on the substrate a photosensitive layer containing DNQ, novolak, and optionally imidazole; (ii) applying onto the substrate functional material containing at least one amino group; (iii) before or after step (ii), irradiating in a pattern the photosensitive layer with light of appropriate wavelength(s) to convert DNQ to a ketene compound; and (iv) reacting the amino group with the ketene compound to fix via amido bonding the functional material to the substrate via the photosensitive layer along the pattern.

15 Claims, 8 Drawing Sheets

METHOD FOR FIXING FUNCTIONAL MATERIAL AND PATTERNED FUNCTIONAL MATERIAL

INDUSTRIAL FIELD

The invention relates to a method for fixing functional materials on a substrate and a substrate on which one or more functional materials are ordered and fixed.

BACKGROUND ART

Techniques for controlling biomolecular architectures on the surface have a wide range of potential applications in biosensing, cell guidance and molecular electronics. Advances in constructing, on the surface, arranged molecular structures for vertically incorporating biologically active molecules and cells in their architecture, are followed by a growing interest in ordering these structures laterally, that is patterning.

It is an object of the invention to provide a method for patterning and fixing functional materials on a substrate.

DISCLOSURE OF THE INVENTION

The invention provides a method for fixing one or more functional materials and a substrate on which one or more functional materials are ordered and fixed.

Item 1. A method for fixing one or more functional materials on a substrate comprising:
step (i): forming a coating layer comprising DNQ and novolak on the substrate;
step (ii): applying at least one amino group-containing functional material onto the substrate;
step (iii): exposure of the substrate to light of appropriate wavelength(s) to form a pattern and to fix the functional material along the pattern via amido bond; and step (iv): optionally repeating steps (ii) and (iii);

Item 2. A method for fixing one or more functional materials on a substrate comprising:
step (i): forming a coating layer comprising DNQ and novolak on the substrate;
step (ii): exposure of the substrate to light of appropriate wavelength(s) to form a pattern;
step (iii): applying at least one amino group-containing functional material and a coupling agent onto the substrate to fix the functional material along the pattern via amido bond; and optionally
step (iv): repeating steps (ii) and (iii).

Item 3. A method for fixing one or more functional materials on a substrate comprising:
step (i): forming a coating layer comprising DNQ and novolak on the substrate;
step (ii): exposure of the coating layer to light of appropriate wavelengths to form a pattern;
step (iii): reverse-baking said pattern with ammonia gas;
step (iv): applying at least one amino group-containing functional material onto the substrate;
step (v): exposure of the substrate to light of appropriate wavelength(s) to form a pattern and to fix the functional material along the pattern via amido bond; and step (vi): optionally repeating steps (ii) to (v) or steps (iv) to (v).

Item 4. A method for fixing one or more functional materials on a substrate comprising:
step (i): forming a coating layer comprising DNQ and novolak on the substrate;
step (ii): exposure of the substrate with light of appropriate wavelengths to form a pattern;
step (iii): reverse-baking said pattern with ammonia gas;
step (iv): exposure of the substrate to light of appropriate wavelength(s) to form a pattern;
step (v): applying at least one amino group-containing functional material and a coupling agent onto the substrate to fix the functional material along the pattern via amido bond; and
step (vi): optionally repeating steps (ii) to (v) or (iv) to (v).

Item 5. The method for fixing one or more functional materials on a substrate according to items 1–4, wherein said coating layer further comprises imidazole together with DNQ and novolak.

Item 6. The method for fixing one or more functional materials on a substrate according to any one of items 1–5 wherein said functional materials are at least one selected from the group consisting of proteins, enzymes, polysaccharides, nucleic acids, microorganisms, viruses and cultured cells.

Item 7. The method for fixing one or more functional materials on a substrate according to item 6 wherein said functional material is nerve cell.

Item 8. A functional material fixed on a substrate which is obtainable according to a method of any one of items 1–7.

Item 9. The functional material according to item 8 wherein 2 or more functional materials are fixed on a substrate along different patterns, respectively.

Said functional material with at least one amino group of the invention is fixed along a pattern formed on a substrate surface. With respect to positive pattern, "order" or "arrange" means fixing functional material at the site of irradiation with light of appropriate wavelength(s). With respect to negative pattern, "order" or "arrange" means fixing functional material at the site of unirradiation with light of appropriate wavelength(s).

Functional materials include amino group-containing polymers and giant molecules, such as proteins, enzymes, polysaccharides, nucleic acids, microorganisms, viruses and cultured cells, but are not specifically limited to.

Proteins are not specifically limited to, but includes hypothalamic hormones (TRH, LH-RH, etc.), anterior pituitary hormones (LH, FSH, TSH, GH, PRL and ACTH), posterior pituitary hormones (oxytocin, vasopressin, etc.), gut hormones (secretin, insulin, glucagon, etc.) and like peptide hormones; interferons ($\alpha$, $\beta$, $\gamma$), interleukins (IL1 to IL6, etc.), avidin, albumin, actin, myosin, fibrin, hemoglobin and like proteins from mammals. Said proteins may be glycoproteins.

Enzymes include oxidoreductase (dehydrogenase, oxidase, reductase, oxygenase, hydroperoxidase), hydrolases (protease, esterase, glycosidase), transferases (methyltransferase, carboxytransferase, acyltransferase, aminotransferase, glycosyltransferase), lyases (aldolase, decarboxylase, dehydratase, carboxykinase), isomerases (racemase, epimerase, cistrans isomerase, tautomerase, $\Delta$-isomerase, mutase, cycloisomerase), synthases (DNA ligase, citrate synthase, malate synthase, anthranilate synthase, etc.).

Polysaccharides include polysaccharides having aminosugar (glucosamine, mannosamine, galactosamine) as a repeating unit.

Nucleic acids include DNA and RNA.

Microorganisms include *E. coli*, yeast, bacillus subtilis, etc.

Viruses include influenza virus, herpes virus, adenovirus, AIDS virus, hepatitis virus (A, B, C types).

Cultured cells include nerve cell, tumor cell, cells from organ, tissue and lymphocyte.

Preferable functional materials are proteins such as avidin, and nerve cell.

Material of substrate on which pattern is formed is not specifically limited to, but includes glass, ceramic, plastics, natural or synthetic resins. Shape of substrate is not specifically limited to, but flat plate is preferable.

(I) DNQ/novolak System

(I-i) Patterning Positive Tone

Pattern formation on a substrate may be carried out by exposure of a photosensitive resin layer made of DNQ/novolaklight to light of appropriate wave length (eg. 436 nm line of HG lamp spectrum). Said substrate is covered by spincoat, application, spray or dipping of DNQ/novolak solution in a solvent (eg. benzene, toluene, chloroform, etc.) followed by drying the solution to form the photosensitive resin layer.

A proportion of DNQ and novolak in the photosensitive resin layer are not limited as long as pattern may be formed. Said proportion suitable for pattern formation may be determined by those skilled in the art. For example, DNQ/novolak=1–50/99–50 wt. %; preferably about 30/about 70 wt. %. DNQ/novolak is conventionally available as AZ1350 (Hechst) and MP1400 (Shipley) which are suitably used.

A method to form pattern is shown in the following scheme.

(Step A)

(STEP B)

wherein $R_1$—N=C=N—$R_2$ represents EDC(1-ethyl-3-(3'-dimethylaminopropyl)-carbodiimido). $R_3$ and $R_4$ represent functional materials without one amino group.

(Step A)

A culture medium or a solvent such as water containing functional material ($R_3NH_2$ or $R_4NH_2$), is added onto a substrate. The coating layer formed on a substrate is irradiated with light of (eg. Hg lamp) to convert DNQ (1) to ketene compound (2). The ketene compound is reacted with an amino group of functional material presented in said culture medium or solvent such as water so as to order or fix the functional material along pattern.

(Step B)

The coating layer formed on a substrate is exposed to light in the absence of water. Water is added to the substrate to convert DNQ (1) to indenecarboxylic acid compound (3). The indenecarboxylic acid compound (3) is reacted with EDC ($R_1$—N=C=N—$R_2$) and functional material in the presence of solvent such as water to order or fix the functional material along the site of irradiation with light via amide bond.

EDC is used in an equimolar or excess amount based on an amount of functional material. Any coupling agent to form an amido bond, such as dicyclohexyl-carbodiimide (DCC), water soluble carbodiimide (WSC), carbonyldiimidazole may be used in place of EDC.

Functional material is fixed about 10 to $10^7$ per 1 cm² of substrate in the case of cells, and 10 to $10^{12}$ per 1 cm² of substrate in the case of proteins.

(I-ii) Patterning Negative Tone

DNQ at the site of irradiation with light is removed by exposure of a substrate to light in the presence of ammonia (NH$_3$) gas or by adding ammonia (NH$_3$) solution on a substrate after exposure of the substrate to light, followed by heat treatment of the substrate at about 100° C. for 0.5 to 1 hour. Functional material may be fixed on a substrate in the same manner as (i) patterning positive tone at the remaining site of unirradiation with light.

(II) DNQ/novolak/imidazole System (II-i) Reverse Step

Immidazole is blended to photosensitive resin made of DNQ/novolak to obtain a ternary composition.

Imidazole is blended to a mixture of DNQ and novolak (preferably, DNQ/novolak=1–50/99–50 wt. %) in an amount of about 0.5 to 4% by weight based on the amount of DNQ). Preferable DNQ/novolak/imidazole mixture is obtained by adding imidazole to DNQ/novolak (=about 30/70 wt. %) in an amount of about 0.15–0.6% by weight based on the amount of DNQ/novolak.

Pattern formation on a substrate may be carried out by exposure of photosensitive resin to light in an intensity of about 30–120 mJ/cm2 Said substrate is covered by spincoat, application, spray or dipping of DNQ/novolak/imidazole solution in the same manner as (1-i) to form a photosensitive layer on the substrate. The pattern obtained is heat-treated in the absence of ammonia gas at about 100° C. for 0.5 to 1 hour to form negative tone pattern.

Fixation of functional material on a substrate may be carried out in the same manner as said (I) DNQ/novolak/imidazole system.

Specific procedures of step A and step B are shown in schemes 1–8. Since schemes 1–8 are only examples, skilled artisan may carry out the invention in different condisions.

-continued

Removing the bioactive molecule solution:
Step 1: place the substrate on the bottom of a well in a culture dish;
Step 2: throughly wash the surface of the resist;
Step 3 (optional): expose all area to remove possible flourescence form the unexposed DNQ

↓

End of the negative patterning
through ketene linkage with bioactive molecule
during flood exposure of the DNQ/novolak system Scheme 4:
Method of attachment of bioactive molecules:
EDC mediated attachment
Material: DNQ/novolak
Patterning tone: Negative From scheme 3

↓

Fixing Exposure:
Energy: from 30 to 120 mJ/cm2
Printing method: proximity/contact;
Mask: clear, optional with features.

↓

Bioactive molecule fixing outside patterned features:
Step 1: add on the top of the patterned resist bioactive molecule solution;
Step 2: add EDC solution;
Step 3: wait 2 hours at room temperature.

↓

Removing the bioactive molecule solution:
Step 1: place the substrate on the bottom of a well in a culture dish;
Step 2: throughly wash the surface of the resist;
Step 3 (optional): expose all area to remove possible flourescence form the unexposed DNQ

↓

End of the negative patterning
through EDC linkage with bioactive molecule
during flood exposure of the DNQ/novolak system In schemes 1, 2, 5 and 6, "subsequent patterning (optional)" will be carried out one or more times to obtain a substrate on which two or more functional materials are fixed.

With respect to scheme 3, processes of:
(a) Bioactive molecule liquid film adhesion (Scheme 3);
(b) Fixing Exposure (Scheme 3); and
(c) Steps 1 and 2 of Removing the bioactive molecule solution (Scheme 3);
may be repeated one or more times after Step 2 of Removing the bioactive molecule solution (Scheme 3) so that two or more functional materials are fixed on a substrate.

Alternatively, processes of:
(a) Patterning Exposure (Scheme 2);
(b) Reversal bake (Scheme 3);
(c) Bioactive molecule liquid film adhesion (Scheme 3);
(d) Fixing Exposure (Scheme 3); and
(e) Steps 1 and 2 of Removing the bioactive molecule solution (Scheme 3);
may be repeated one or more times after Step 2 of Removing the bioactive molecule solution (Scheme 3) so that two or more functional materials are fixed on a substrate.

With respect to scheme 4, processes of:
(a) Fixing Exposure (Scheme 4);
(b) Bioactive molecule fixing outside patterned features (Scheme 4); and
(c) Steps 1 and 2 of Removing the bioactive molecule solution (Scheme 4);
may be repeated one or more times after Step 2 of Removing the bioactive molecule solution (Scheme 4) so that two or more functional materials are fixed on a substrate.

Alternatively, processes of:

(a) Patterning Exposure (Scheme 2);
(b) Fixing Exposure (Scheme 4);
(c) Bioactive molecule fixing outside patterned features (Scheme 4); and
(d) Steps 1 and 2 of Removing the bioactive molecule solution (Scheme 4);

may be repeated one or more times after Step 2 of Removing the bioactive molecule solution (Scheme 4) so that two or more functional materials are fixed on a substrate.

With respect to schemes 7 and 8, two or more functional materials may be fixed on a substrate according to the same procedure as schemes 3 and 4.

According to the invention, any functional material having one or more amino groups may be fixed along pattern formed on a substrate.

Pattern formation may be carried out two or more times to fix different kinds of functional materials along each pattern. For example, enzymes with similar primary structure may be fixed continuously to investigate relationship between enzyme and substrate thereof. Further, plural of nerve cells may be fixed continuously to form network structure which is useful to study mechanism of action of nerve cells. In addition, interrelated amino group-containing functional materials with respect to muscle, blood coagulation system or electron transport system may be arranged in a predetermined position in order to investigate interrelation of functional materials.

When nerve cell is fixed on a substrate on which transistor is previously formed, said substrate will be useful as a sensor or electron device to perceive change of electric potential of nerve cell.

Best Mode for Carrying Out the Invention

The invention will be described in detail in view of the examples. However, the invention is in no way limited to the examples.

Figure 1:
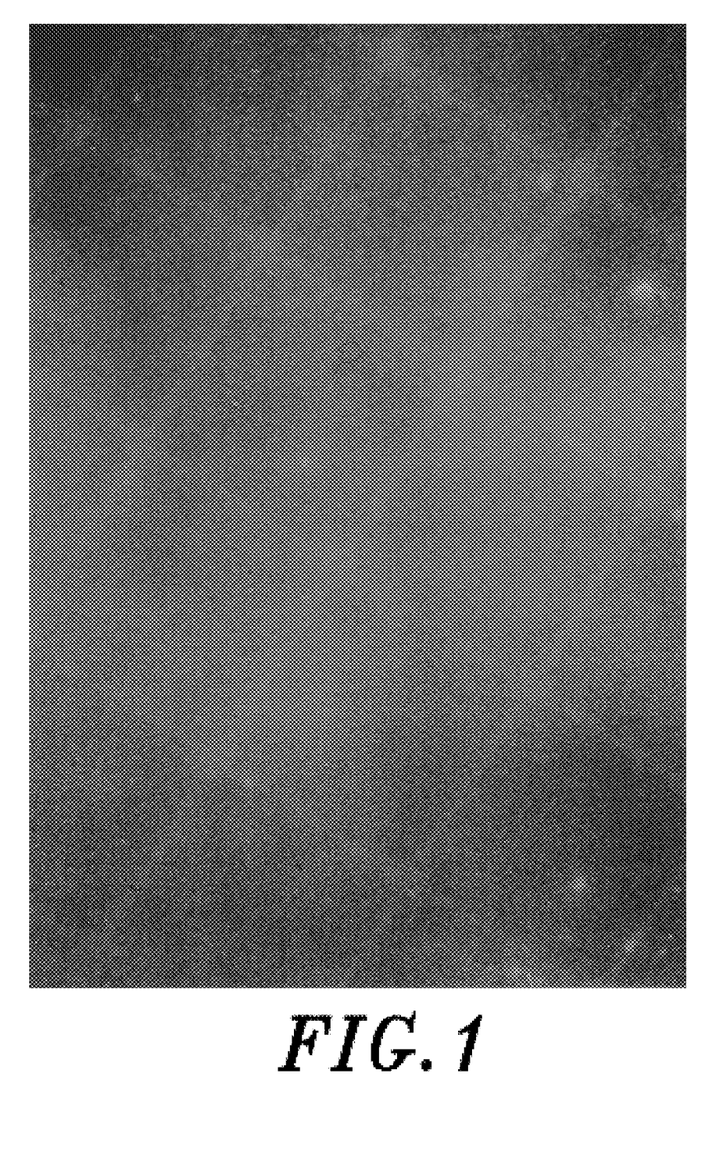
FIGS. 1–8 show the results of fluoresence test to evaluate avidin attachment on patterned substrate obtained according to schemes 1–8.

EXAMPLE 1
Fixation of Avidin on a Substrate According to Scheme 1
(1) Substrate Preparation A resin mixture of diazonaphtoquinone (DNQ) and novolak (about 30: about 70% by weight) was dissolved in ethylene glycol monoethyl ether acetate to prepare a solution with about 30% solid content. The solution was spin-coated on a cover glass (circular glass plate; diameter=15 mm; thickness=0.13 mm) pretreated with liquid hexamethyldisilazane (HMDS) for resist adhesion at a spread cycle of 500 rpm, 30 seconds and then 3,000 rpm, 1 minute to form a resist film having a uniform thickness of 0.45 $\mu$m. The resulting plate was dried in convection oven at 90° C. for 30 minutes to form a substrate.
(2) Avidin Binding A solution of avidin combined with fluorescein (0.01 mg) in water (0.5 ml) was added on the top of the substrate. Subsequently, a mask with pattern was pressed onto the substrate surface. Avidin was linked to the substrate by exposure to 436 nm line of HG lamp spectrum having an energy of 30 to 120 mJ/cm$^2$. Said substrate was washed to remove an excess avidin. FIG. 1 shows the results when the substrate was exposed to light (500 nm) to observe fluorescence. FIG. 1 clearly shows that avidin molecules are arranged along the pattern.

EXAMPLE 2
Fixation of Avidin on a Substrate According to Scheme 2
Pattern was formed in the same manner as example 1 by exposure of a substrate to 436 nm line of HG lamp spectrum having an energy of 30 to 120 mJ/cm$^2$ A solution (0.5 ml) of EDC (4 mg) in water (1 ml) was added on the top of the substrate. Avidin was linked to the substrate by adding a solution (0.02 ml) of avidin (1 mg) in water (1 ml) to said EDC solution immediately after addition of EDC solution, followed by treating the substrate at 23° C. for 2 hours. The substrate was then washed to remove an excess avidin. Arrangement of avidin molecule along pattern was confirmed by observing fluorescence after exposure of the resulting substrate to light (500 nm).

Figure 2:
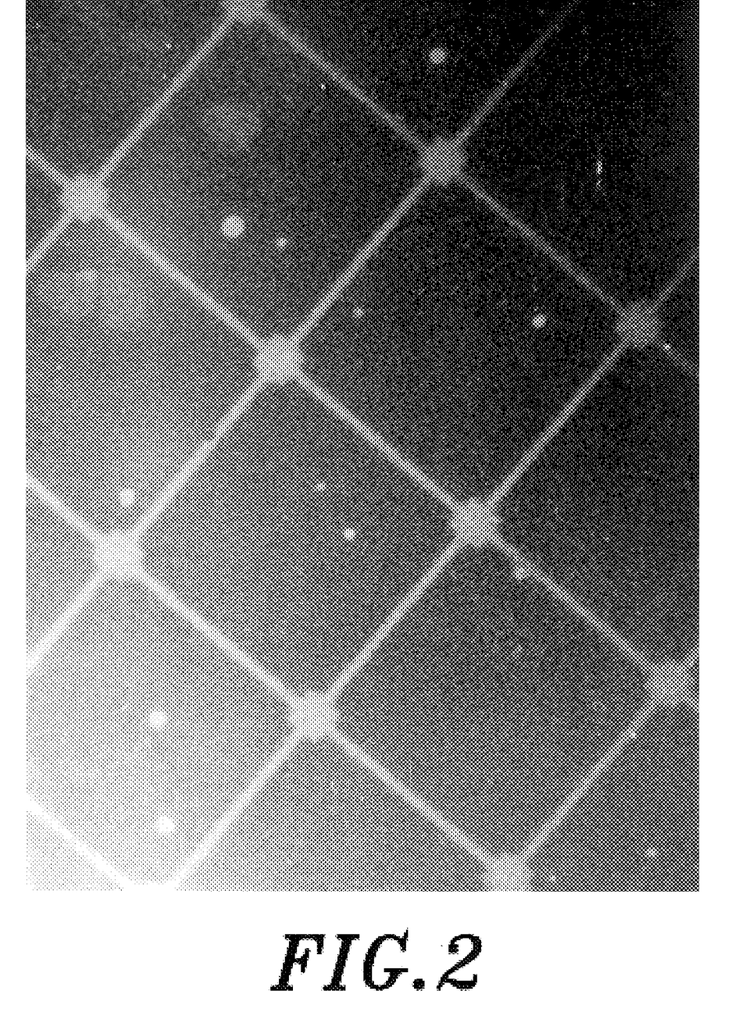

The results of fluorescence test were shown in FIG. 2. According to the results of fluorescence test, more avidins in example 2 than in example 1 were combined with the substrate.

EXAMPLE 3
Fixation of Avidin on a Substrate According to Scheme 3

Figure 3:
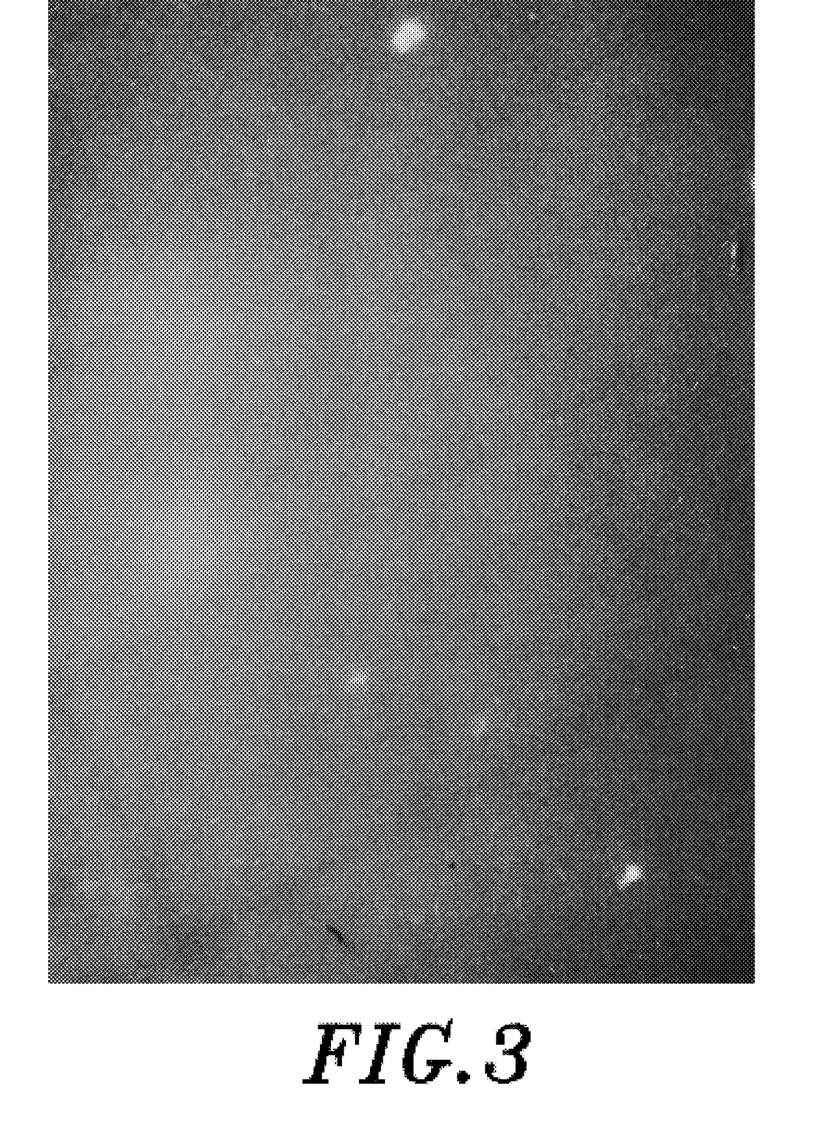

A reverse bake process was carried out by baking the substrate under ammonia gas atmosphere at 100° C. for 60 minutes. DNQ at the site of exposure was removed by washing the substrate with water. Avidin was directly linked to the substrate along pattern in the same manner as example 1. The results of fluorescence test were shown in FIG. 3. According to the results of fluorescence test, it was observed that avidin was fixed in objected compartments.

EXAMPLE 4
Fixation of Avidin on a Substrate According to Scheme 4

Avidin was linked in the same manner as example 2 after EDC activation to the substrate having pattern after reverse bake process performed in example 3.

Figure 4:
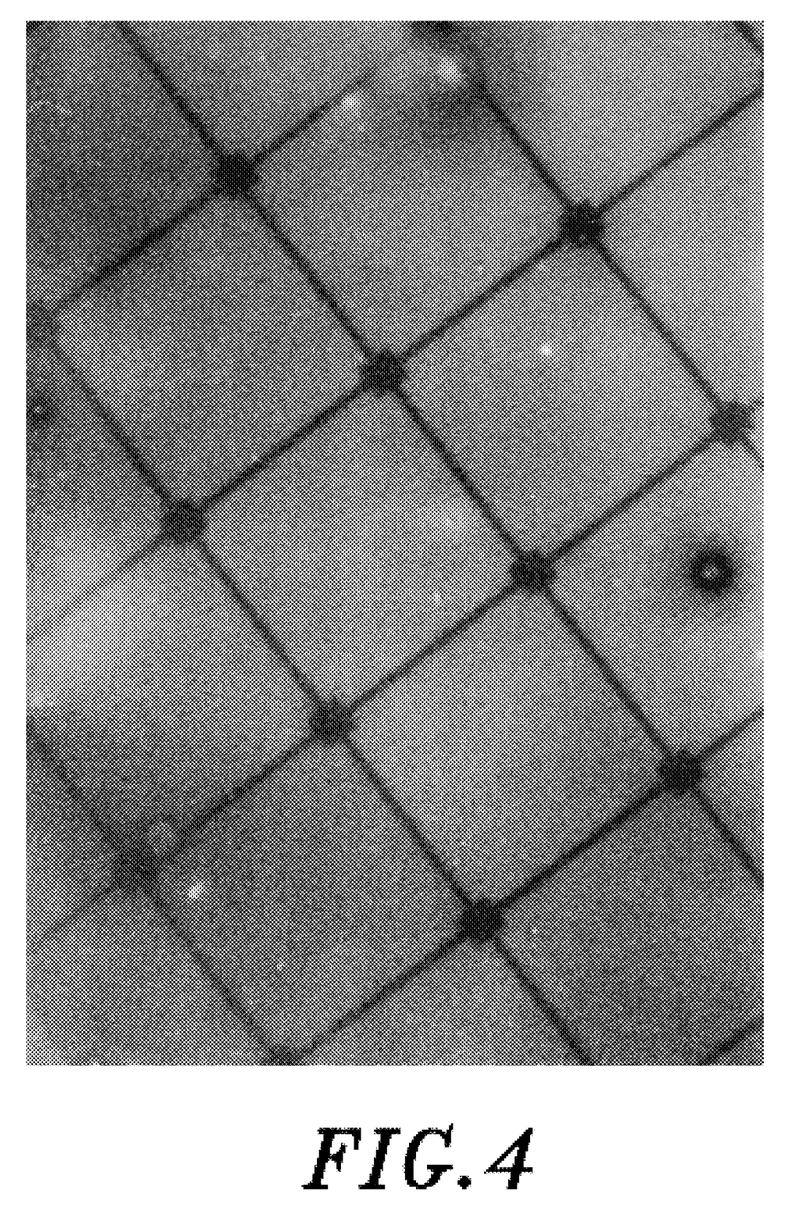

The results of fluorescence test were shown in FIG. 4. According to the results of fluorescence test, it was observed that avidin was fixed in objected compartments.

EXAMPLE 5
Fixation of Avidin on a Substrate According to Scheme 5

Avidin was linked to the substrate in the same manner as example 1 except that DNQ/novolak/imidazole system further blended with 0.15 to 0.6% by weight of imidazole was used in place of DNQ/novolak system.

Figure 5:
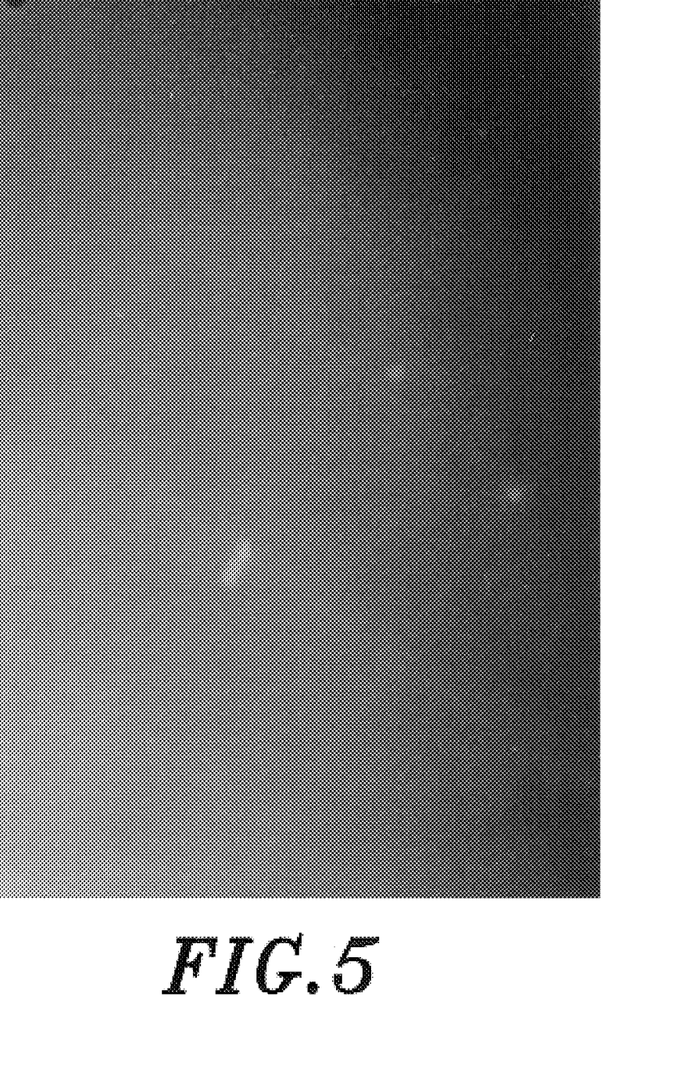

The results of fluorescence test were shown in FIG. 5. According to the results of fluorescence test, it was observed that avidin was fixed in objected compartments.

EXAMPLE 6
Fixation of Avidin on a Substrate According to Scheme 6

Avidin was linked to the substrate in the same manner as example 2 except that DNQ/novolak/imidazole system further blended with 0.15 to 0.6% by weight of imidazole was used in place of DNQ/novolak system.

Figure 6:
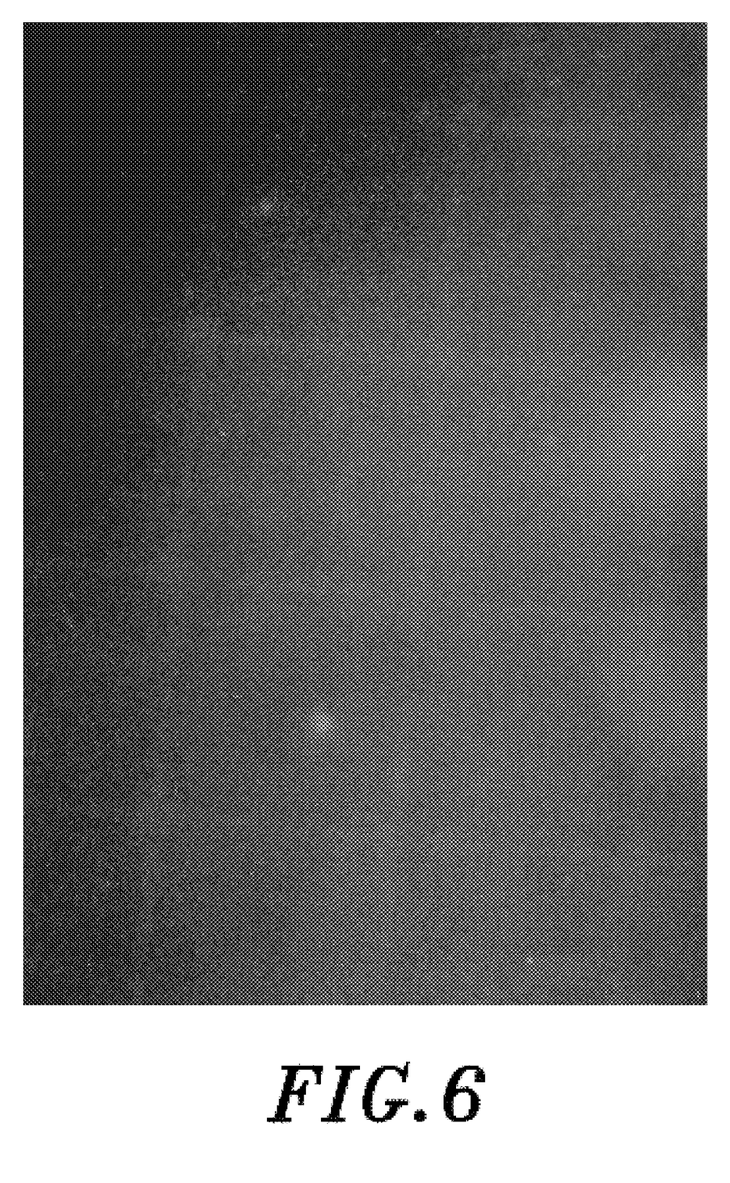

The results of fluorescence test were shown in FIG. 6. According to the results of fluorescence test, it was observed that avidin was fixed in objected compartments.

EXAMPLE 7
Fixation of Avidin on a Substrate According to Scheme 7

Avidin was linked to the substrate in the same manner as example 3 except that DNQ/novolak/imidazole system further blended with 0.15 to 0.6% by weight of imidazole was used in place of DNQ/novolak system.

Reverse bake was carried out in the absence of ammonia gas.

Figure 7:
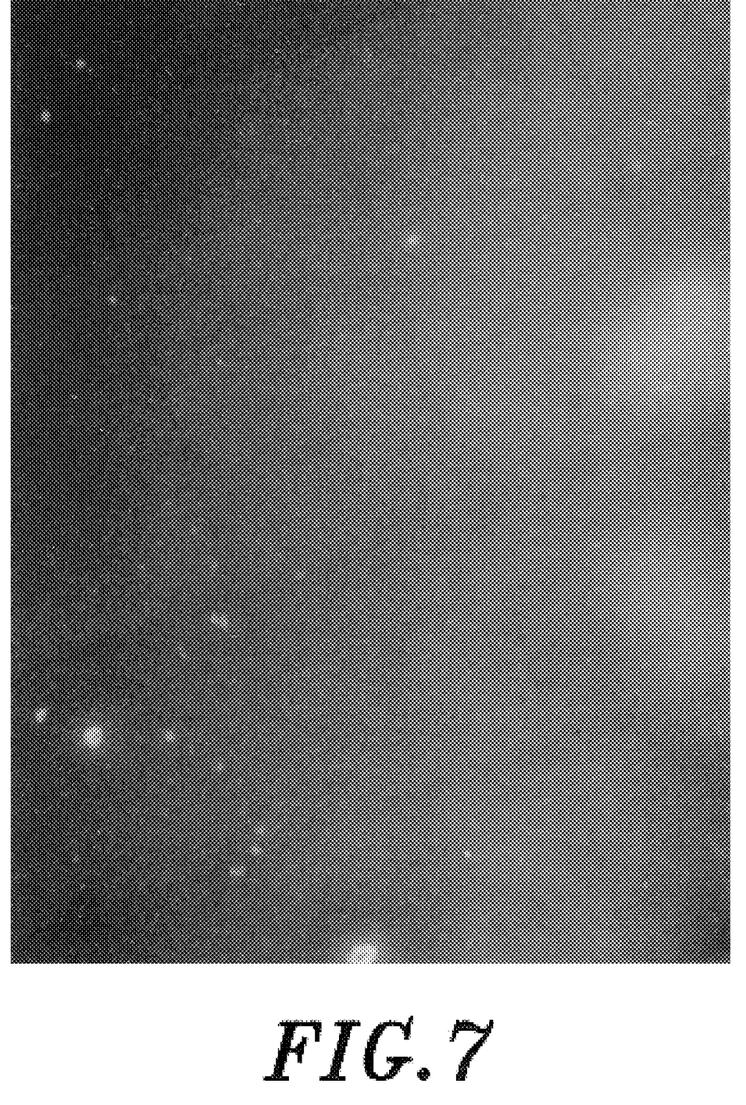

The results of fluorescence test were shown in FIG. 7. According to the results of fluorescence test, it was observed that avidin was fixed in objected compartments.

EXAMPLE 8

Fixation of Avidin on a Substrate According to Scheme 8

Avidin was linked to the substrate in the same manner as example 4 except that DNQ/novolak/imidazole system further blended with 0.15 to 0.6% by weight of imidazole was used in place of DNQ/novolak system.

Reverse bake was carried out in the absence of ammonia gas.

Figure 8:
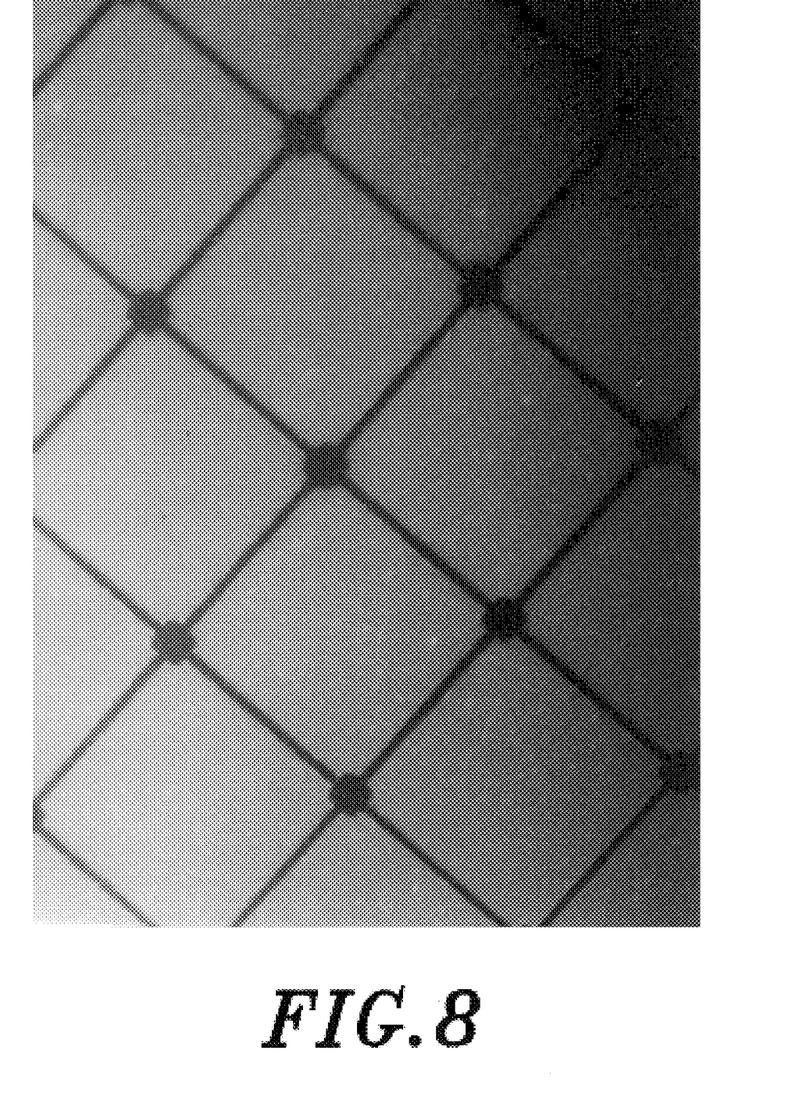

The results of fluoresence test were shown in FIG. 8. According to the results of fluorescence test, it was observed that avidin was fixed in objected compartments.

Within the results of examples 1–8, the results of example 8 using reverse image was the best in the number of avidin linked to the substrate.

What is claimed is:

1. A method for fixing at least one functional material on a substrate, comprising the steps of:
   (i) forming a photosensitive layer comprising DNQ and novolak on the substrate;
   (ii) applying onto the photosensitive layer a functional material containing at least one amino group;
   (iii) irradiating in a pattern said photosensitive layer with light of appropriate wavelength(s) to convert DNQ to a ketene compound, wherein the photosensitive layer is photo-reacted where irradiated;
   (iv) reacting said at least one amino group with said ketene compound to fix via amido bonding said functional material to said substrate via said photo-reacted layer along said pattern; and
   (v) optionally repeating steps (ii) through (iv).

2. The method for fixing at least one functional material on a substrate according to claim 1, wherein said photosensitive layer further comprises imidazole.

3. The method for fixing at least one functional material on a substrate according to claim 1, wherein said at least one functional material is selected from the group consisting of proteins, enzymes, polysaccharides, nucleic acids, microorganisms, viruses and cultured cells.

4. The method for fixing at least one functional material on a substrate according to claim 1, wherein, in application step (ii), said functional material further comprises a coupling agent.

5. The method for fixing at least one functional material on a substrate according to claim 1, further comprising, between steps (i) and (ii), tone-reversing steps of irradiating in a patterns baking in the presence of ammonia gas, and washing said photosensitive layer to remove DNQ present where irradiated, wherein a non-irradiated area of the photosensitive layer remains photosensitive and inclusive of DNQ.

6. The method for fixing at least one functional material on a substrate according to claim 5, wherein, in application step (ii), said functional material further comprises a coupling agent.

7. The method for fixing at least one functional material on a substrate according to claim 5, wherein the tone-reversing steps, steps (ii), (iii), and (iv) are repeated.

8. A method for fixing at least one functional material on a substrate, comprising the steps of:
   (i) forming a photosensitive layer comprising DNQ and novolak on the substrate;
   (ii) irradiating in a pattern the photosensitive layer with light of appropriate wavelength(s) to convert DNQ to a ketene compound, wherein the photosensitive layer is photo-reacted where irradiated;
   (iii) applying onto the photo-reacted layer a functional material containing at least one amino group;
   (iv) reacting the at least one amino group with the ketene compound to fix via amido bonding the functional material to the substrate via the photo-reacted layer along the pattern; and
   (v) optionally repeating steps (ii) through (iv).

9. The method for fixing at least one functional material on a substrate according to claim 8, further comprising, between steps (i) and (ii), tone-reversing steps of irradiating in a pattern, baking in the presence of ammonia gas, and washing said photosensitive layer to remove DNQ present where irradiated, wherein a non-irradiated area of the photosensitive layer remains photosensitive and inclusive of DNQ.

10. The method for fixing at least one functional material on a substrate according to claim 8, wherein said photosensitive layer further comprises imidazole.

11. The method for fixing at least one functional material on a substrate according to claim 8, wherein said at least one functional material is selected from the group consisting of proteins, enzymes, polysaccharides, nucleic acids, microorganisms, viruses and cultured cells.

12. The method for fixing at least one functional material on a substrate according to claim 1, further comprising, between steps (i) and (ii), tone-reversing steps of irradiating in a pattern, baking in the presence of ammonia gas, and washing said photosensitive layer to remove DNQ present where irradiated, wherein a non-irradiated area of the photosensitive layer remains photosensitive and inclusive of DNQ.

13. The method for fixing at least one functional material on a substrate according to claim 10, further comprising, between steps (i) and (ii), tone-reversing steps of irradiating in a pattern, baking in the absence of ammonia gas, and washing said photosensitive layer to remove DNQ present where irradiated, wherein a non-irradiated area of the photosensitive layer remains photosensitive and inclusive of DNQ.

14. The method for fixing at least one functional material on a substrate according to claim 9, wherein, in application step (iii), said functional material further comprises a coupling agent.

15. The method for fixing at least one functional material on a substrate according to claim 2, further comprising, between steps (i) and (ii), tone-reversing steps of irradiating in a pattern, baking in the absence of ammonia gas, and washing said photosensitive layer to remove DNQ present where irradiated, wherein a non-irradiated area of the photosensitive layer remains photosensitive and inclusive of DNQ.

* * * * *

UNITED STATES PATENT AND TRADEMARK OFFICE
CERTIFICATE OF CORRECTION

PATENT NO.   : 6,066,438
DATED        : May 23, 2000
INVENTOR(S)  : Dan V. Nicolau, et al.

It is certified that error appears in the above-identified patent and that said Letters Patent is hereby corrected as shown below:

On the title page: Item [73] Assignee, please change from "Director General of Industrial Science & Technology" to --Director General, Agency of Industrial Science & Technology--.

Signed and Sealed this

Twenty-second Day of May, 2001

*Attest:*

NICHOLAS P. GODICI

*Attesting Officer*     Acting Director of the United States Patent and Trademark Office